United States Patent
Christensen et al.

(10) Patent No.: US 6,645,796 B2
(45) Date of Patent: Nov. 11, 2003

(54) METHOD AND SEMICONDUCTOR STRUCTURE FOR IMPLEMENTING REACH THROUGH BURIED INTERCONNECT FOR SILICON-ON-INSULATOR (SOI) DEVICES

(75) Inventors: Todd Alan Christensen, Rochester, MN (US); John Edward Sheets, II, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/990,477

(22) Filed: Nov. 21, 2001

(65) Prior Publication Data

US 2003/0094653 A1 May 22, 2003

(51) Int. Cl.[7] .............................................. H01L 21/00
(52) U.S. Cl. ....................... 438/149; 438/164; 438/622
(58) Field of Search ................................ 438/152, 622, 438/149, 153, 154, 164

(56) References Cited

U.S. PATENT DOCUMENTS

| | | | |
|---|---|---|---|
| 5,241,211 A | * 8/1993 | Tashiro | 257/347 |
| 5,352,916 A | * 10/1994 | Kiyno et al. | 257/393 |
| 5,569,620 A | * 10/1996 | Linn et al. | 438/406 |
| 5,889,306 A | 3/1999 | Christensen et al. | |
| 6,121,659 A | 9/2000 | Christensen et al. | |
| 6,187,660 B1 | * 2/2001 | Gardner | 438/264 |
| 6,228,731 B1 | * 5/2001 | Liaw et al. | 257/347 |
| 6,258,669 B1 | * 7/2001 | Park | 438/299 |
| 6,287,901 B1 | 9/2001 | Christensen et al. | |
| 2002/0008283 A1 | * 1/2002 | Ju | 438/622 |
| 2002/0068428 A1 | * 6/2002 | Kuwazawa | 438/618 |
| 2002/0113288 A1 | * 8/2002 | Clevenger et al. | 257/513 |

* cited by examiner

Primary Examiner—Michael Trinh
(74) Attorney, Agent, or Firm—Joan Pennington

(57) ABSTRACT

A method and semiconductor structure including silicon-on-insulator (SOI) devices are provided for implementing reach through buried interconnect. A semiconductor stack includes a predefined buried conductor to be connected through multiple insulator layers and at least one intermediate conductor above the predefined buried conductor. A hole is anisotropically etched through the semiconductor stack to the predefined buried conductor. The etched hole extends through the at least one intermediate conductor and the insulators to the predefined buried conductor in the semiconductor stack. A thin layer of insulator is deposited over an interior of the etched hole. The deposited thin insulator layer is anisotropically etched to remove the deposited thin insulator layer from a bottom of the hole exposing the predefined buried conductor in the semiconductor stack with the thin insulator layer covering sidewalls of the hole to define an insulated opening. The insulated opening is filled with an interconnect conductor to create a connection to the predefined buried conductor in the semiconductor stack. A semiconductor structure for implementing reach through buried interconnect in building semiconductors including silicon-on-insulator (SOI) devices includes the semiconductor stack. An etched hole extends through at least one intermediate conductor and the insulators to the predefined buried conductor in the semiconductor stack. A thin layer of insulator covers sidewalls of the etched hole providing an insulated opening. An interconnect conductor extending through the insulated opening is connected to the predefined buried conductor in the semiconductor stack.

8 Claims, 6 Drawing Sheets

100

| INSULATOR 102 |
| CONDUCTOR 108 |
| INSULATOR 104 |
| CONDUCTOR 110 |
| INSULATOR 106 |

US 6,645,796 B2

METHOD AND SEMICONDUCTOR STRUCTURE FOR IMPLEMENTING REACH THROUGH BURIED INTERCONNECT FOR SILICON-ON-INSULATOR (SOI) DEVICES

FIELD OF THE INVENTION

The present invention relates to a method and semiconductor structure for implementing reach through buried interconnect in building semiconductors including silicon-on-insulator (SOI) devices.

DESCRIPTION OF THE RELATED ART

Fabricating smaller, more densely packed devices having greater computing capability is a continuing objective in building semiconductor devices. Silicon-on-insulator (SOI) technology is an enhanced silicon technology currently being utilized to increase the performance of digital logic circuits. By utilizing SOI technology designers can increase the speed of digital logic integrated circuits or can reduce their overall power consumption. These advances in technology are leading to the development of more complex and faster computer integrated circuits that operate with less power.

It is desirable in building semiconductors including SOI technology to fabricate a connection from a conductor at a given level through a stack including a first insulator, an intermediate conductor, and a second insulator to another conductor without making electrical connection to the intermediate conductor. Such a connection is referred to as a reach through buried interconnect.

A need exists for an effective mechanism in building semiconductors including SOI technology for fabricating such a reach through buried interconnect.

SUMMARY OF THE INVENTION

Principal objects of the present invention are to provide a method and semiconductor structure including silicon-on-insulator (SOI) devices for implementing reach through buried interconnect. Other important objects of the present invention are to provide such method and semiconductor structure for implementing reach through buried interconnect substantially without negative effect and that overcome many of the disadvantages of prior art arrangements.

In brief, a method and semiconductor structure including silicon-on-insulator (SOI) devices are provided for implementing reach through buried interconnect. A semiconductor stack includes a predefined buried conductor to be connected through multiple insulator layers and at least one intermediate conductor above the predefined buried conductor. A hole is anisotropically etched through the semiconductor stack to the predefined buried conductor. The etched hole extends through the at least one intermediate conductor and the insulators to the predefined buried conductor in the semiconductor stack. A thin layer of insulator is deposited over an interior of the etched hole. The deposited thin insulator layer is anisotropically etched to remove the deposited thin insulator layer from a bottom of the hole exposing the predefined buried conductor in the semiconductor stack with the thin insulator layer covering sidewalls of the hole to define an insulated opening. The insulated opening is filled with an interconnect conductor to create a connection to the predefined buried conductor in the semiconductor stack.

A semiconductor structure for implementing reach through buried interconnect in building semiconductors including silicon-on-insulator (SOI) devices includes a semiconductor stack including a predefined buried conductor to be connected through multiple insulator layers and at least one intermediate conductor above the predefined buried conductor. An etched hole extends through the at least one intermediate conductor and the insulators to the predefined buried conductor in the semiconductor stack. A thin layer of insulator covers sidewalls of the etched hole providing an insulated opening. An interconnect conductor extending through the insulated opening is connected to the predefined buried conductor in the semiconductor stack.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

Having reference now to the drawings, in FIGS. 1–6, there are shown exemplary processing steps for implementing reach through buried interconnect for semiconductor fabrication including silicon-on-insulator (SOI) devices in accordance with the preferred embodiment. In accordance with features of the invention, in building semiconductors including SOI technology a connection is fabricated from a conductor at a given level through a stack including insulators and one or more intermediate conductors to another conductor without making electrical connection to the intermediate conductors.

Figures 1, 2:
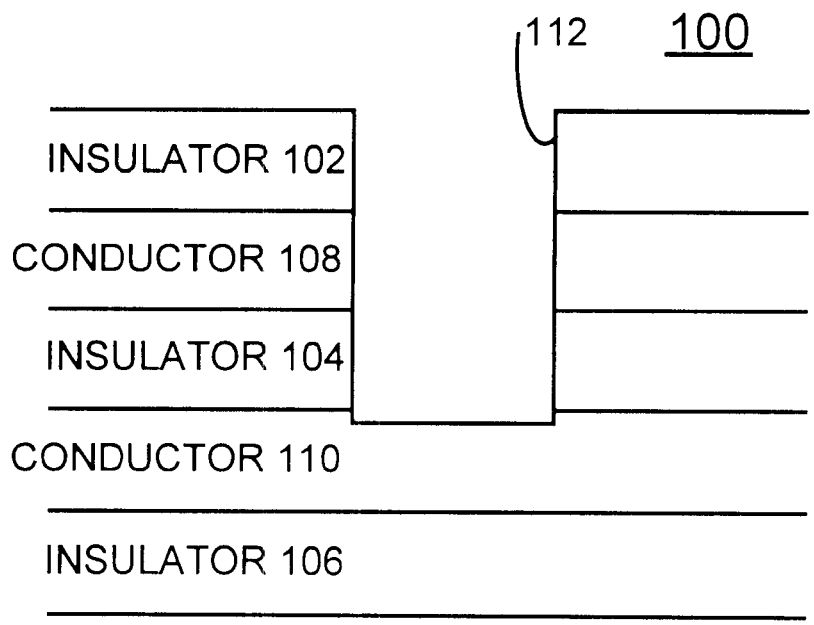
FIGS. 1–6 are schematic cross-sectional views illustrating exemplary processing steps for implementing reach through buried interconnect in building semiconductors including silicon-on-insulator (SOI) devices in accordance with the preferred embodiment.

Referring to FIG. 1, the processing method begins with a given semiconductor stack 100 of a plurality of insulators 102, 104, 106 and a plurality of conductors 108, 110. As shown, stack 100 includes alternating layers of insulator 102, conductor 108, insulator 104, conductor 110, and insulator 106. The processing method of the preferred embodiment provides a connection to the lower, buried conductor 110 through the stack 100 without making electrical connection to the intermediate conductor 108.

Referring to FIG. 2, then a hole 112 is anisotropically etched through the stack and stops on the buried conductor 110 that is the desired connection, as shown. The location for hole 112 is defined by conventional photoresist technique. The elongate hole 112 is anisotropically etched through the top insulator 102, intermediate conductor 108, insulator 104 to the lower buried conductor 110. Etching is done with an anisotropic etch process, for example, a reactive ion etch (RIE) process using plasma etchants. Anisotropic etchants cut directly downwardly through the stack 100 to the lower buried conductor 110 substantially without any additional etching in the horizontal plane.

Figure 3:
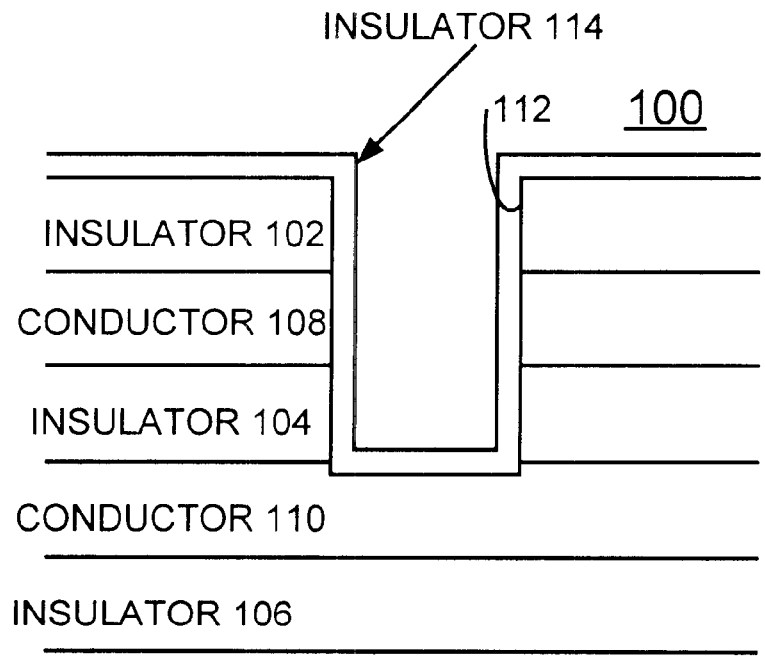

Referring to FIG. 3, a thin layer of insulator 114 is conformally deposited covering the entire interior of the hole 112 and a top surface of the top insulator 102. For example, the deposited thin insulator layer 114 typically is much thinner than the insulator 102, 104, 106. The deposited thin insulator layer 114 has a substantially uniform thickness generally less than 10% of the diameter of the hole 112. The deposited thin insulator layer 114 has a thickness, for example, in a range of 50–500 angstroms.

Figure 4:
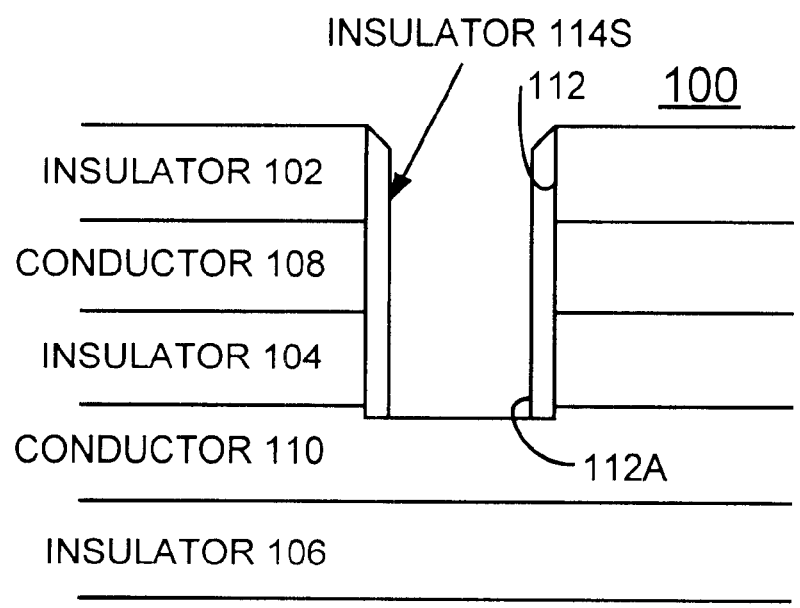

Referring to FIG. 4, a short anisotropic etch of the deposited insulator 114 is performed so that an insulator 114S is left only along the sidewalls of the hole 112. The deposited thin insulator 114 is etched away along the bottom of the hole 112 exposing the buried conductor 110 and is etched away the top surface of the insulator 102. The anisotropic etching removes the deposited thin insulator 114 from the flat bottom of the hole 112 and the flat top surface of the insulator 102 with a reactive ion etch (RIE) process using an appropriate plasma etchant. An elongate insulated opening 112A through the stack 100 to the buried conductor 110 is defined by the insulator 114S covering the sidewalls of the hole 112.

Figure 5:
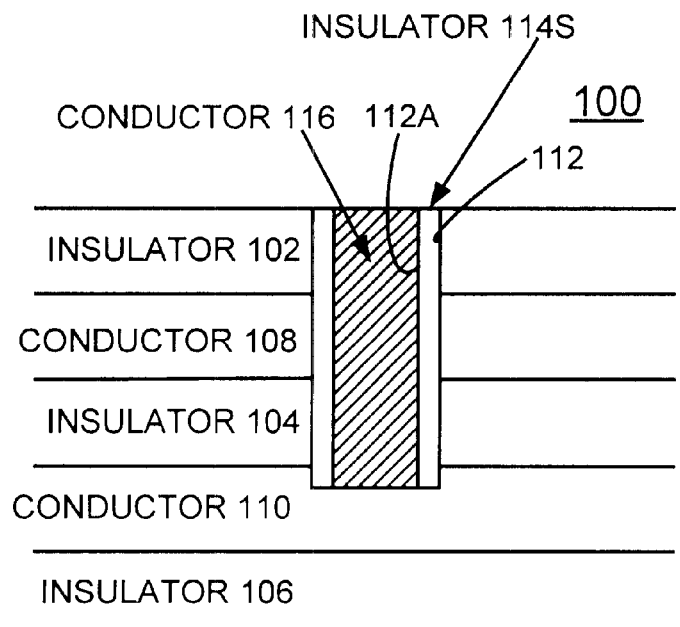

Referring to FIG. 5, the insulated opening 112A is then filled and polished with an interconnect conductor 116, typically tungsten. Conductor 116 is formed of an electrically conductive material selected from the group including, for example, copper, conductive doped silicon, platinum, palladium, rhodium, aluminum, tantalum, titanium, tungsten and titanium-tungsten. Conductor 116 is deposited, for example, by conventional sputtering, evaporation, or chemical vapor deposition (CVD) processes so as to fill in the insulated opening 112A. This metal interconnect conductor 116 is polished, for example, using a conventional chemical-mechanical polishing process, to form the metal interconnect conductor 116 in the hole 112.

Figure 6:
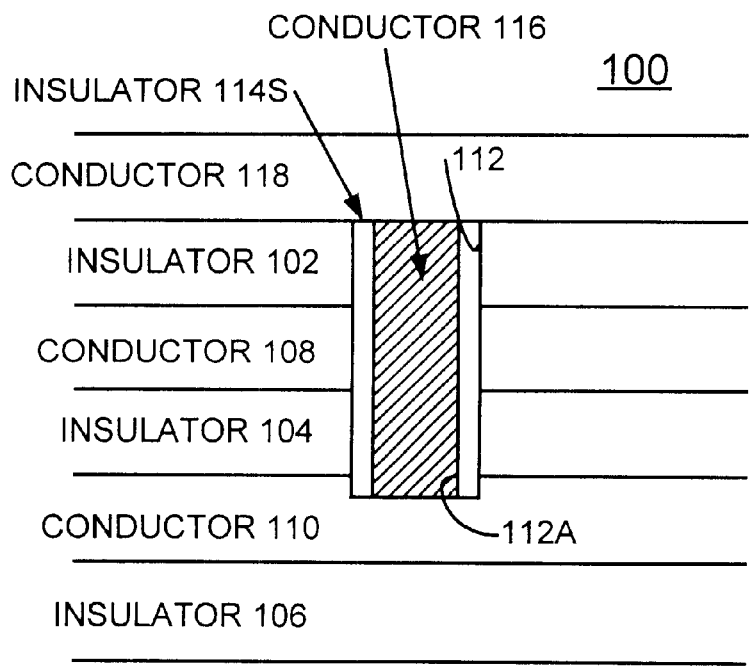

Referring to FIG. 6, a top level conductor 118 can then be deposited and patterned to complete the connection with conductor 116 thus creating an electrical connection from the top conductor 118 through to the bottom conductor 110 without connection to any intermediate conductor. It should be understood that the top level conductor 118 can be formed by various process steps. For example, an alternative process would be to etch shallow trenches in an additional insulator (not shown) above the insulator 102 for the top conductor 118, and fill shallow trenches and polish the top conductor 118, typically using copper.

In accordance with features of the preferred embodiment, the processing method of the preferred embodiment is extendable to reaching through an indefinite number of intermediate conductors. It should be understood that multiple intermediate conductors can be included in stack 100 rather than the single intermediate conductor 108 as shown in FIG. 1.

In accordance with features of the preferred embodiment, the processing method of the preferred embodiment is applicable for silicon-on-insulator (SOI) technology.

Figure 7:
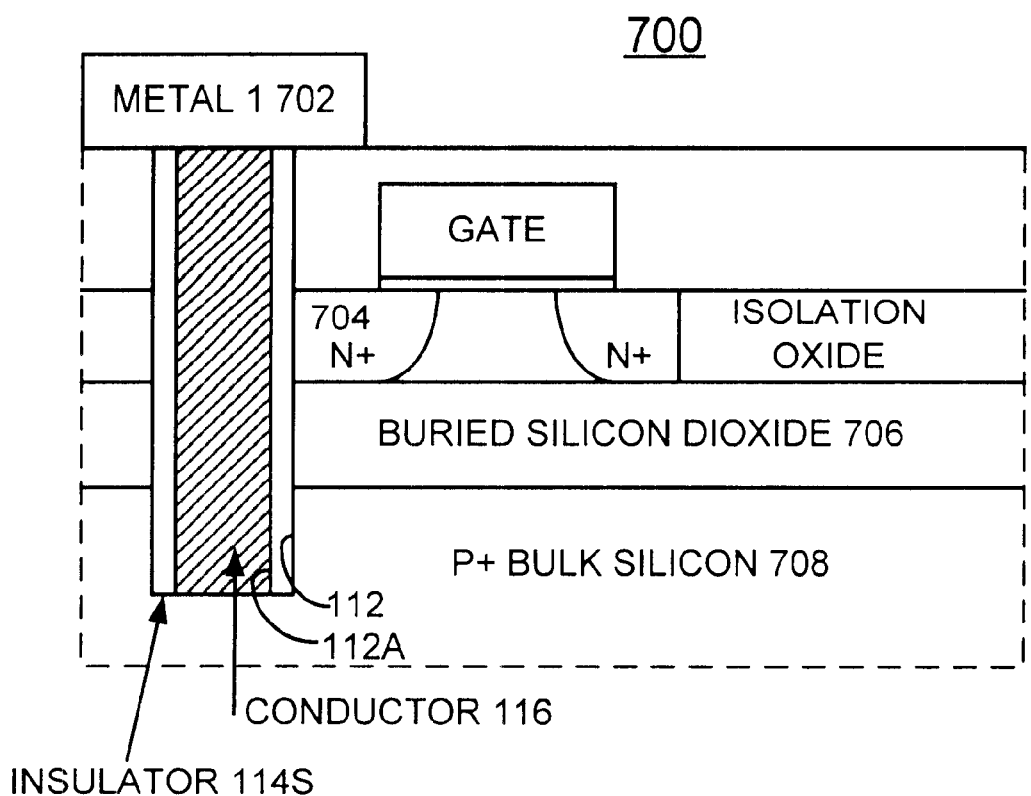
FIGS. 7–9 are schematic cross-sectional views respectively illustrating reach through buried interconnect for silicon-on-insulator (SOI) devices in accordance with the preferred embodiment.
Figure 8:
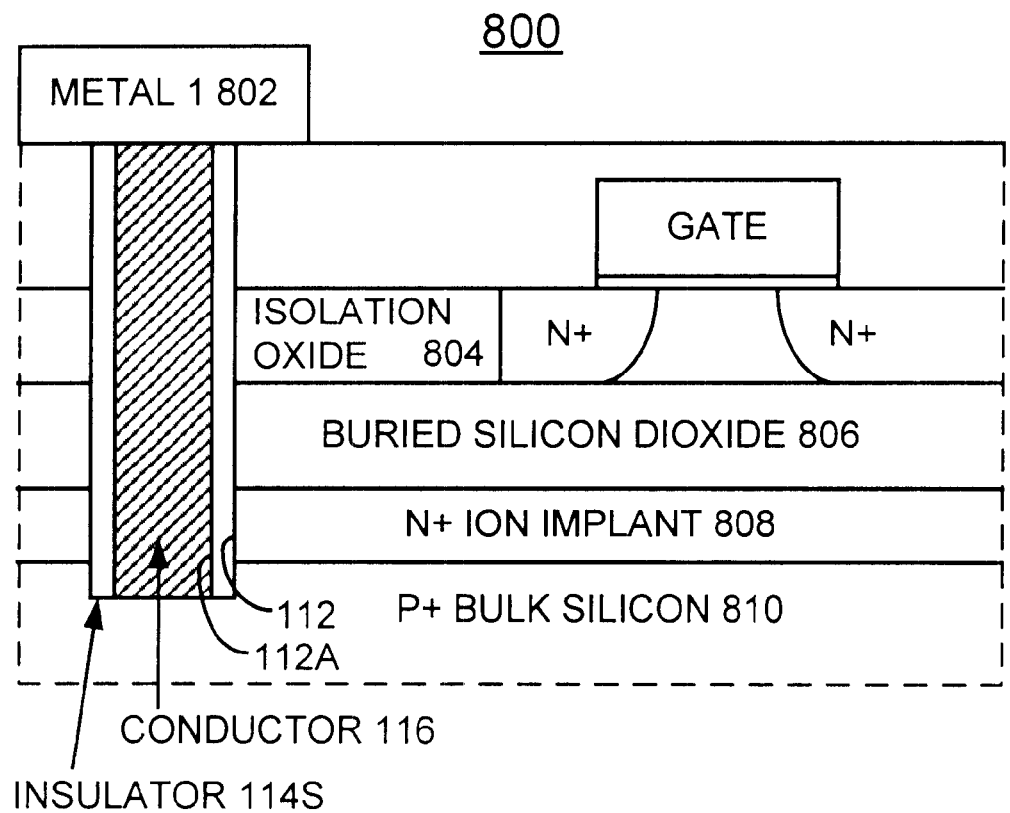
Figure 9:
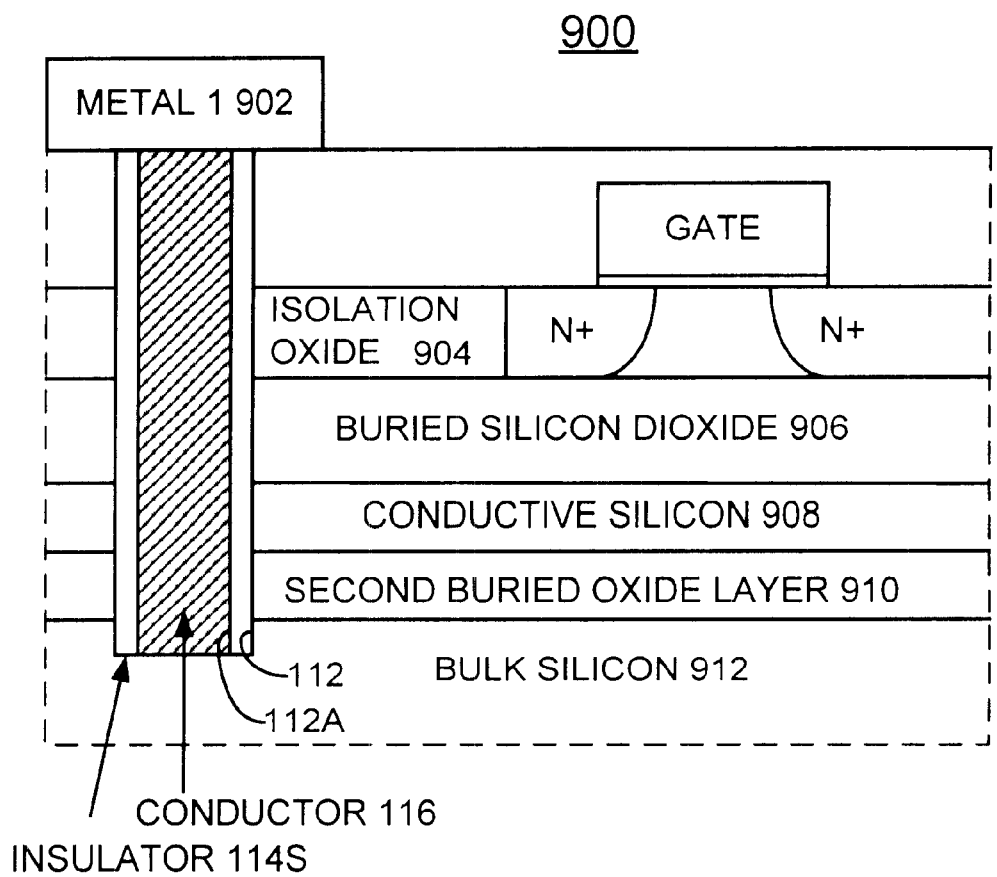

FIGS. 7–9 respectively illustrate reach through buried interconnect for silicon-on-insulator (SOI) devices in accordance with the preferred embodiments. In FIGS. 7–9, the same reference numbers are used for identical or similar components of the reach through buried interconnect as used in FIGS. 1–6.

Referring to FIG. 7, there is shown a first SOI embodiment generally designated by the reference character 700. A connection made from a first level of metal 702 reaching through the diffusion layer 704 and through a buried oxide 706 to make connection to a bulk silicon 708. The connection is made with interconnect conductor 116 contained within the insulated opening 112A defined by the thin insulator 114S covering the sidewalls of the hole 112 that is fabricated as illustrated and described in FIGS. 1–6.

Referring to FIG. 8, there is shown another SOI embodiment generally designated by the reference character 800. In SOI embodiment 800 a connection is made from the first level of metal 802 through an isolation oxide 804 and a buried oxide 806 and reaching through an implanted layer 808 just below the buried oxide 806 down to a bulk silicon 810. This allows multiple conducting layers in the bulk silicon under the buried oxide. The connection is made with interconnect conductor 116 contained within the insulated opening 112A defined by the thin insulator 114S covering the sidewalls of the hole 112 that is fabricated as illustrated and described in FIGS. 1–6.

Referring to FIG. 9, there is shown a further SOI embodiment generally designated by the reference character 900. In SOI embodiment 900 a connection is made from the first level of metal 902 through an isolation oxide 904, a buried oxide 806 and reaching through a conductive silicon layer 908 just below the buried oxide 906 and a second buried oxide 910 down to a bulk silicon 912. A connection could be made to connect the first layer of metal 902 and reach through one or more conducting layers in the bulk to a lower conducting level 908, or to the bulk silicon 912 as shown in FIG. 9. The connection is made with interconnect conductor 116 contained within the insulated opening 112A defined by the thin insulator 114S covering the sidewalls of the hole 112 that is fabricated as illustrated and described in FIGS. 1–6.

While the present invention has been described with reference to the details of the embodiments of the invention shown in the drawings, these details are not intended to limit the scope of the invention as claimed in the appended claims.

What is claimed is:

1. A method for implementing reach through buried interconnect in building semiconductors including silicon-on-insulator (SOI) devices comprising the steps of:

providing a semiconductor stack including a predefined buried conductor to be connected and including multiple insulator layers and at least one intermediate conductor above said predefined buried conductor; said multiple insulator layers including a first buried oxide layer and a second buried oxide layer; said second buried oxide layer spaced apart from said first buried oxide layer with said at least one intermediate conductor;

anisotropically etching a hole through said semiconductor stack to said predefined buried conductor, said etched hole extending through said at least one intermediate conductor and said insulator layers including said first buried oxide layer and said second buried oxide layer to said predefined buried conductor in said semiconductor stack;

depositing a thin layer of insulator over an interior of said etched hole;

anisotropically etching said deposited thin insulator layer to remove said deposited thin insulator layer from a bottom of said etched hole exposing said predefined buried conductor in said semiconductor stack with said thin insulator layer covering sidewalls of said hole to define an insulated opening;

filling said insulated opening with an interconnect conductor to create a connection to said predefined buried conductor in said semiconductor stack; and wherein the step of anisotropically etching a hole through said semiconductor stack to said predefined buried conductor includes the step of anisotropically etching a hole through an isolation oxide layer and said at least one intermediate conductor and said insulator layers including said first buried oxide layer and said second buried oxide layer to a bulk silicon; said predefined buried conductor comprising said bulk silicon.

2. A method for implementing reach through buried interconnect in building semiconductors including silicon-on-insulator (SOI) devices comprising the steps of:

providing a semiconductor stack including a predefined buried conductor to be connected and including multiple insulator layers and at least one intermediate conductor above said predefined buried conductor; said multiple insulator layers including a first buried oxide layer and a second buried oxide layer; said second buried oxide layer spaced apart from said first buried oxide layer with said at least one intermediate conductor;

anisotropically etching a hole through said semiconductor stack to said predefined buried conductor, said etched hole extending through said at least one intermediate conductor and said insulator layers including said first buried oxide layer and said second buried oxide layer to said predefined buried conductor in said semiconductor stack;

depositing a thin layer of insulator over an interior of said etched hole;

anisotropically etching said deposited thin insulator layer to remove said deposited thin insulator layer from a bottom of said hole exposing said predefined buried conductor in said semiconductor stack with said thin insulator layer covering sidewalls of said hole to define an insulated opening; filling said insulated opening with an interconnect conductor to create a connection to said predefined buried conductor in said semiconductor stack; and wherein the step of anisotropically etching a hole through said semiconductor stack to said predefined buried conductor includes the step of anisotropically etching a hole through an isolation oxide layer, said first buried oxide layer, said at least one intermediate conductor including a conducting layer below said first buried oxide layer, and said second buried oxide layer in said semiconductor stack to a bulk silicon; said predefined buried conductor comprising said bulk silicon.

3. A method for implementing reach through buried interconnect in building semiconductors including silicon-on-insulator (SOI) devices as recited in claim 2 wherein the step of filling said hole with said interconnect conductor to create said connection to said predefined buried conductor in said semiconductor stack includes the step of filling said hole with said interconnect conductor formed of tungsten.

4. A method for implementing reach through buried interconnect in building semiconductors including silicon-on-insulator (SOI) devices as recited in claim 2 wherein the step of filling said hole with said interconnect conductor to create said connection to said predefined buried conductor in said semiconductor stack includes the step of filling said hole with said interconnect conductor formed of an electrically conductive material selected from the group including copper, conductive doped silicon, platinum, palladium, rhodium, aluminum, tantalum, titanium, tungsten and titanium-tungsten.

5. A method for implementing reach through buried interconnect in building semiconductors including silicon-on-insulator (SOI) devices as recited in claim 2 wherein the step of anisotropically etching said hole through said semiconductor stack to said predefined buried conductor includes the step of performing a reactive ion etch (RIE) process using a plasma etchant.

6. A method for implementing reach through buried interconnect in building semiconductors including silicon-on-insulator (SOI) devices as recited in claim 2 wherein the step of depositing said thin layer of insulator over an interior of said etched hole includes the step of depositing said thin layer of insulator over an interior of said etched hole having a thickness in a range of 50–500 angstroms.

7. A method for implementing reach through buried interconnect in building semiconductors including silicon-on-insulator (SOI) devices as recited in claim 2 wherein the step of depositing said thin layer of insulator over an interior of said etched hole includes the step of depositing said thin layer of insulator over an interior of said etched hole having a thickness of less than 10% of a diameter of said etched hole.

8. A method for implementing reach through buried interconnect in building semiconductors including silicon-on-insulator (SOI) devices as recited in claim 2 wherein the step of anisotropically etching said deposited thin insulator layer to remove said deposited thin insulator layer from a bottom of said hole exposing said predefined buried conductor in said semiconductor stack with said thin insulator layer covering sidewalls of said hole includes step of performing a reactive ion etch (RIE) process using a plasma etchant.

\* \* \* \* \*